United States Patent [19]
Kamada

[11] Patent Number: 5,294,751
[45] Date of Patent: Mar. 15, 1994

[54] HIGH FREQUENCY SIGNAL TRANSMISSION LINE STRUCTURE HAVING SHIELDING CONDUCTOR UNIT

[75] Inventor: Chiyoshi Kamada, Kokubunji, Japan

[73] Assignee: Hitachi Ltd., Tokyo, Japan

[21] Appl. No.: 791,291

[22] Filed: Nov. 13, 1991

[30] Foreign Application Priority Data

Nov. 15, 1990 [JP] Japan ................... 2-309258

[51] Int. Cl.⁵ .......................................... H01L 23/02
[52] U.S. Cl. ............................ 174/52.4; 174/35 R; 257/659
[58] Field of Search ............... 174/51, 52.4, 35 R, 174/35 MS; 361/424; 257/659, 660

[56] References Cited

U.S. PATENT DOCUMENTS 4,396,795  8/1983  Bogner .............................. 174/35.66
4,925,024  5/1990  Ellenberger et al. ................ 206/328

FOREIGN PATENT DOCUMENTS

63-155791  6/1988  Japan .

*Primary Examiner*—Leo P. Picard
*Assistant Examiner*—Christopher Horgan
*Attorney, Agent, or Firm*—Pennie & Edmonds

[57] ABSTRACT

A high frequency transmission line structure has a reference potential plane conductor layer, a plurality of strip line conductors, a dielectric material layer interposed between the reference potential plane conductor layer and the strip line conductors and a shielding conductor unit provided between adjacent two strip line conductors. The shielding conductor unit includes first and second slender conductor portions extending substantially in a direction parallel with a lengthwise direction of the strip line conductors and connected to be integral with each other at their first ends. The second ends of the first and second slender conductor portions being electrically connected with the reference potential plane conductor layer.

11 Claims, 12 Drawing Sheets

HIGH FREQUENCY SIGNAL TRANSMISSION LINE STRUCTURE HAVING SHIELDING CONDUCTOR UNIT

BACKGROUND OF THE INVENTION

The present invention relates to a wiring technique for various electronic components such as IC device packages, wiring circuit boards, and semiconductor chips, and in particular to a technique which is effective in application of transmission of high frequency signals.

A multi-layer wiring circuit board aiming at reduction of crosstalk noises caused between signal conductors is disclosed in JP-A-63-155791 (laid-open on Jun. 28, 1988). In the above described multi-layer wiring circuit board, it is attempted to reduce crosstalk noises caused by signal propagation by forming ground conductors on both sides of a signal conductor sandwiched between upper and lower ground plane conductor layers, connecting electrically the above described ground conductors to the upper and lower ground plane conductor layers, and thus shielding each signal conductor with these ground conductors and ground plane conductor layers.

SUMMARY OF THE INVENTION

In the above described JP-A-63-155791, however, there is not described resonance caused between a signal conductor and a ground conductor by mutual inductance, which is formed between the signal conductor and the ground conductor, and self-inductance of the signal conductor and the ground conductor. As a result of a study made by the present inventor, it has been found that a high signal frequency ranging nearly from several GHz to several tens GHz degrades waveform or disabled transmission caused by the above described mutual inductance and/or self-inductance.

An object of the present invention is to provide a high frequency signal transmission line structure suitable for transmission of high frequency signals.

Another object of the present invention is to provide a packaged semiconductor device including the above described high frequency signal transmission line structure.

Another object of the present invention is to provide a wiring circuit board including the above described high frequency signal transmission line structure.

According to one aspect of the present invention, a high frequency signal transmission line structure has a reference potential plane conductor layer, a plurality of strip line conductors, a dielectric material layer interposed between the reference potential plane conductor layer and the strip line conductors and a shielding conductor unit provided between adjacent two strip line conductors. The shielding conductor unit includes first and second slender conductor portions extending substantially in a direction parallel with a lengthwise direction of the strip line conductors and connected to be integral with each other at their first ends. The second ends of the first and second slender conductor portions are electrically connected with the reference potential plane conductor layer.

In the above described configuration, the shielding conductor unit interposed between adjacent strip line conductors includes a pair of slender conductor portions having first ends connected with each other and second ends respectively connected with the reference potential plane conductor layer. Therefore, the electromagnetic induction current induced in the shielding conductor unit by a signal current flowing through one signal conductor, i.e., through one strip line conductor has opposite senses in one conductor portion and the other conductor portion included in the shielding conductor unit. With respect to the direction of flow of the signal current, the electromagnetic induction current has a forward direction and a backward direction in one conductor portion and the other conductor portion, respectively. As a result, the self-inductance of the shielding conductor unit and the mutual inductance between the strip line conductors and the shielding conductor unit become small because respective inductance components cancel each other. Accordingly, the frequency $f_0$ of resonance caused between a strip line conductor and the shielding conductor unit becomes large in accordance with the following expression.

$$f_0 = 1/2\pi \sqrt{LC}$$

In this expression, L represents mutual inductance between the strip line conductor and the shielding conductor unit or self-inductance of each of them, and C represents capacitance between conductors.

Therefore, it becomes possible to suppress resonance occurring between strip line conductors and the shielding conductor unit by shifting the above described resonance frequency to the outside of the frequency band of signal current.

DESCRIPTION OF THE PREFERRED EMBODIMENTS

The present invention will hereafter be described in detail by referring to embodiments. In all diagrams for describing embodiments, components having the same functions are denoted by like numerals and will not be described repetitively.

Figure 1:
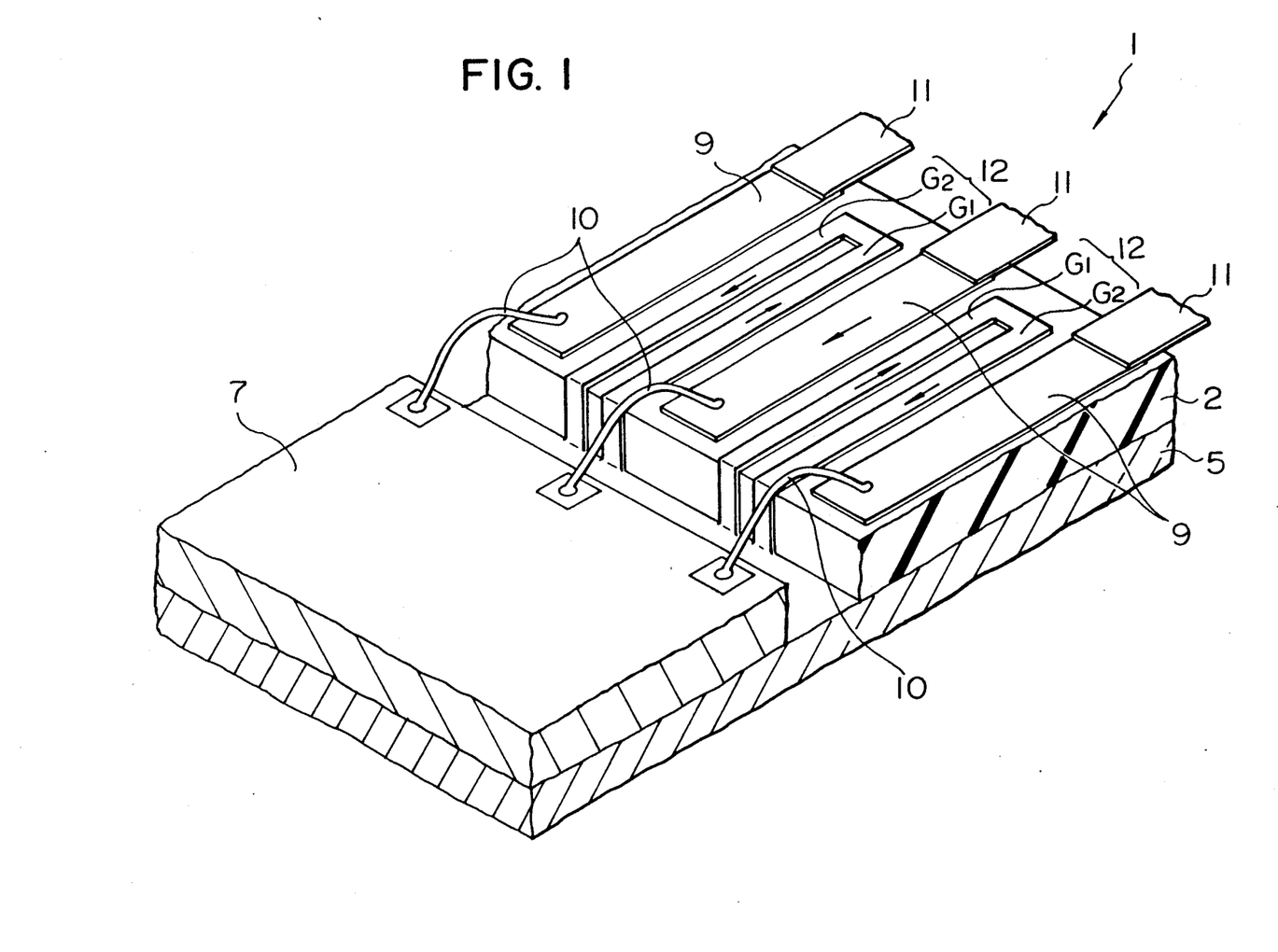
FIG. 1 is a cutaway oblique view of a principal part of a packaged semiconductor device including a high frequency signal transmission line structure according to an embodiment of the present invention.
Figure 2:
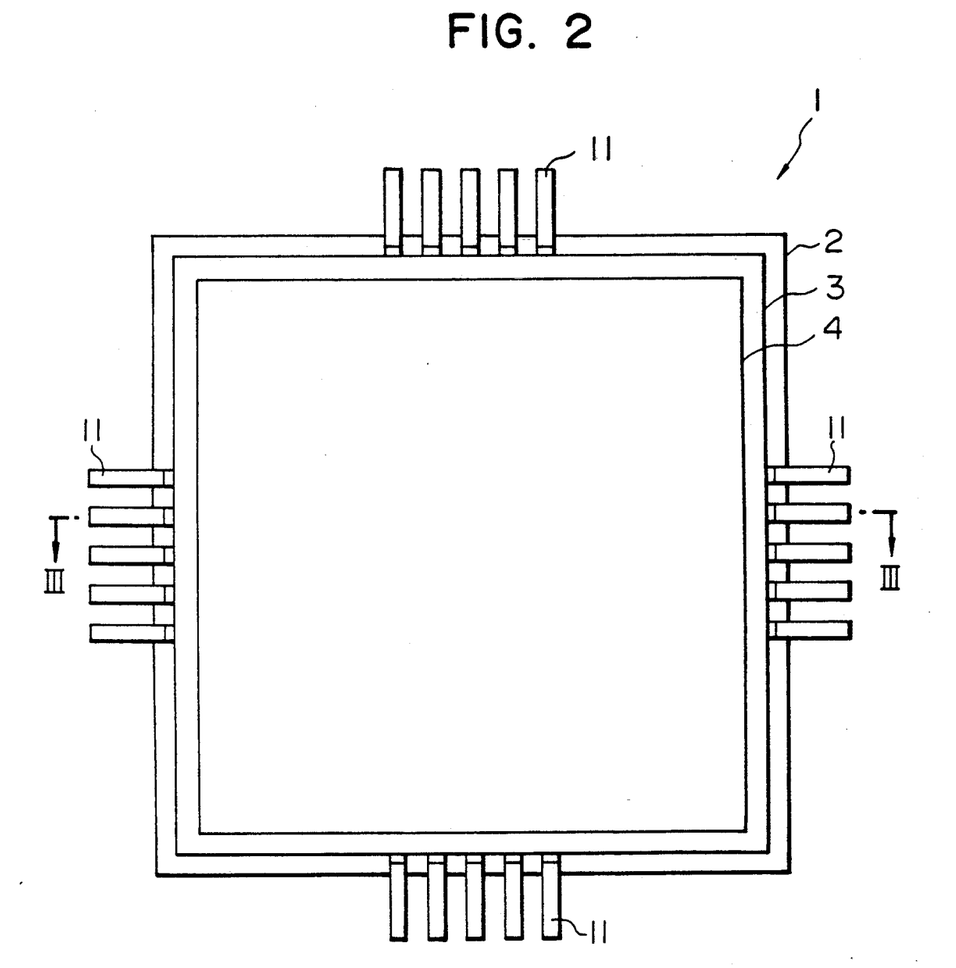
FIG. 2 is a top view of the packaged semiconductor device including the principal part as shown in FIG. 1.
Figure 3:
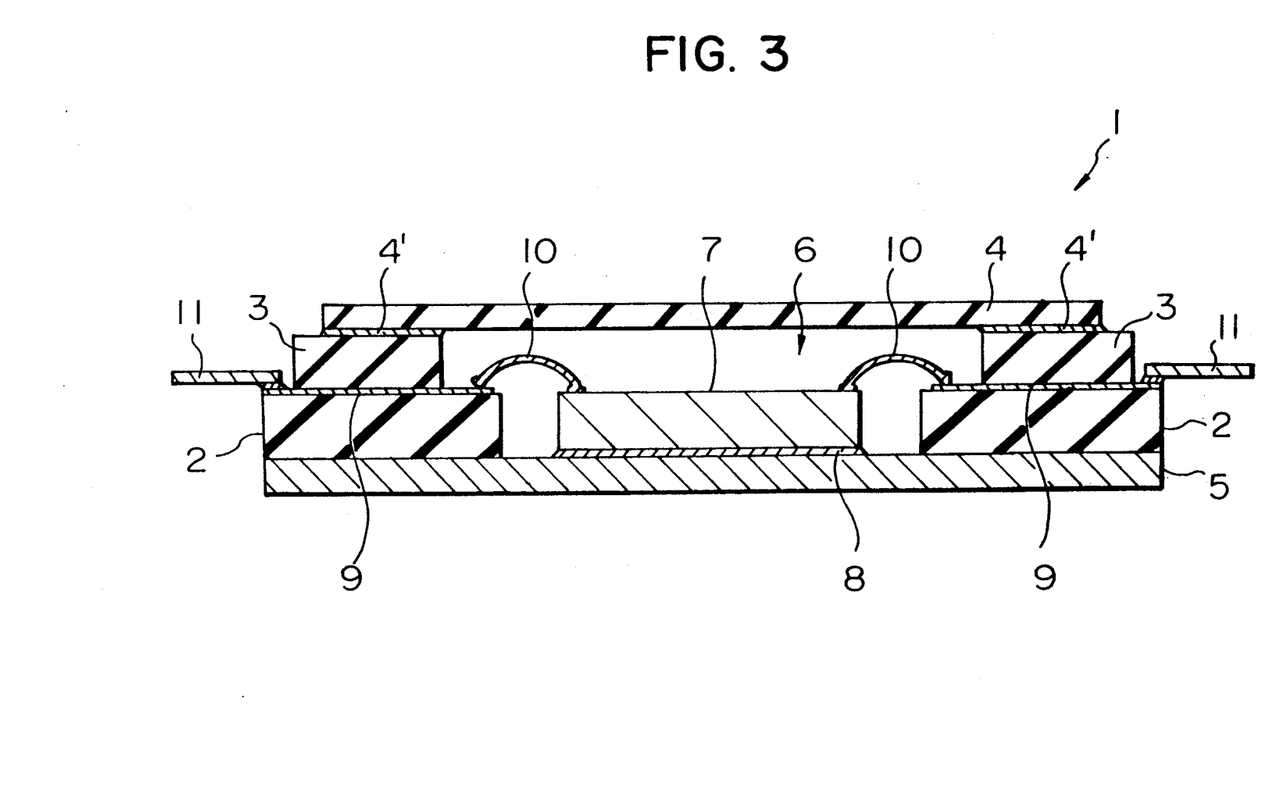
FIG. 3 is a sectional view seen along a line III—III shown in FIG. 2.
Figure 4:
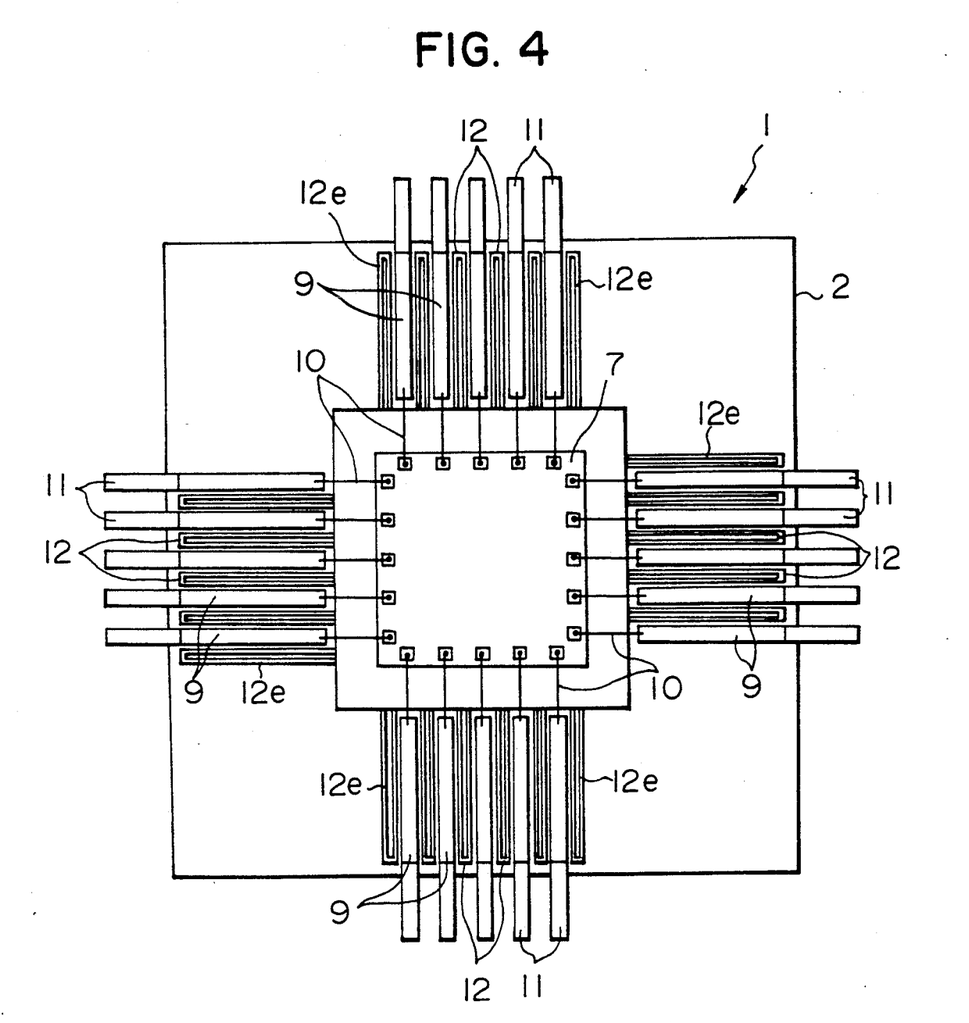
FIG. 4 is a top view showing a conductor pattern in the package of the above described semiconductor device.

A packaged semiconductor device including a high frequency signal transmission line structure according to an embodiment of the present invention is shown in FIGS. 1 to 4. FIG. 1 is an oblique view of principal parts of the package and a semiconductor chip; FIG. 2 is a top view of the package; FIG. 3 is a sectional view seen along a line III—III shown in FIG. 2; and FIG. 4 is a top view showing the arrangement of conductors in the package.

An IC package 1 in the present embodiment is a so-called ceramic package. The package main body includes a dielectric substrate 2 made from a dielectric material layer and an opening therein, a frame-shaped dielectric layer, i.e., a frame member 3, a cap plate 4, and a base plate 5 functioning as a reference potential plane conductor layer for providing a reference potential (GND) plane. The above described dielectric substrate 2, frame-shaped dielectric layer 3, and cap plate 4 are made from ceramics such as alumina, mullite, or aluminum nitride (AlN). The base plate 5 is made from electric conductors such as Kovar, 42 alloy, or mixture of copper powder and tungsten powder. Within a cavity 6 surrounded by the dielectric substrate 2, the frame-shaped dielectric layer 3, the cap plate 4 and the base plate 5, a semiconductor chip 7 made from GaAs (gallium arsenide) having a logical integrated circuit performing switching operation at an ultrahigh speed, for example, is mounted. The semiconductor chip 7 is joined to the upper face of the base plate 5 by a soldering material 8 such as Au-Sn eutectic alloy.

On the principal face of the dielectric substrate 2, a predetermined number of signal conductors, i.e., strip line conductors 9 are formed by means of thick film printing of metal having a high melting point such as W (tungsten). These conductors 9 have a characteristic impedance value (50Ω, for example) equivalent to the impedance value of an external signal source for driving the logical integrated circuit included in the semiconductor chip 7. The strip line conductors 9 form so-called microstrip lines in conjunction with the dielectric substrate 2 having a predetermined dielectric constant value and the base plate, i.e., the reference potential plane conductor layer 5 joined to the bottom face of the dielectric substrate 2. First ends of the strip line conductors 9 are electrically connected with the semiconductor chip 7 via bonding wires 10 made from conductors such as Au. External leads 11 made from conductors such as Kovar or 42 alloy are brazed to second ends of the conductors 9 by soldering.

On the surface of the substrate 2 and between adjacent strip line conductors 9, a shielding conductor unit 12 extending substantially in a direction parallel with the lengthwise direction of the conductors is formed. One end of the shielding conductor unit is electrically connected with the base plate (reference potential plane) 5. That is to say, it is attempted in the packaged semiconductor device of the present embodiment to reduce crosstalk noise at the time of signal propagation by shielding respective strip line conductors 9 with the shielding conductor unit 12 and the base plate (reference potential plane conductor layer) 5. The shielding conductor unit 12 may be made from the same conductive material and formed in the same production process as the strip line conductors, for example. As understood from the foregoing description, the frame member 3 is formed on the strip line conductors 9, the shielding conductor unit 12, and the substrate 2. The cap plate 4 is joined to the upper face of the frame member 3 via a soldering material 4' which is, for example, a conductive material. As evident from FIG. 3, the cap plate 4 covers a substantial part of the base plate 5 and contributes to the formation of a cavity. In order to enhance the above described crosstalk noise reduction effect, an alternative configuration may be adopted. In this alternative configuration, a second reference potential plane is provided above the layer 2 (and within or above the frame member 3, for example) and this reference potential plane is electrically connected with the above described shielding conductor unit. For example, the above described structure can be achieved by providing the layer of the soldering material 4' with the reference potential (such as the ground potential). Or the cap plate 4 may be made of a conductive plate such as a metallic plate and provided with the reference potential.

Figure 5:
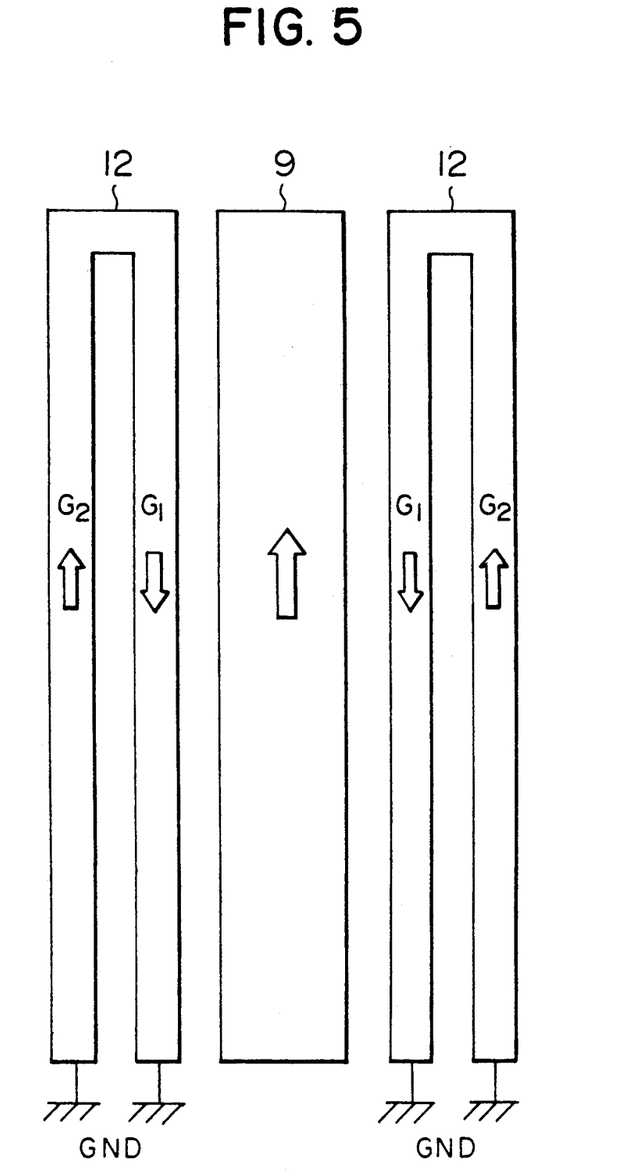
FIG. 5 is a diagram showing respective directions of a signal current flowing through a strip line conductor and an electromagnetic induction current induced in a shielding conductor unit by this signal current.

As shown in FIG. 1, the shielding conductor unit 12 has a hairpin-shaped or U-shaped pattern including a pair of slender conductor portions $G_1$ and $G_2$ connected with each other at their first ends and connected with the reference potential plane conductor layer 5 at their second ends. When a signal current flows through a strip line conductor 9, therefore, an electromagnetic induction current flows through the shielding conductor unit on both sides of the strip line conductor. As shown in FIG. 5, the sense of the electromagnetic induction current in the first conductor portion ($G_1$) is opposite to that in the second conductor portion ($G_2$). With respect to the direction of the flow of the signal current, the electromagnetic induction current has a forward direction and a backward direction in the first conductor portion ($G_1$) and the second conductor portion ($G_2$), respectively. As a result, inductance of the first conductor portion ($G_1$) and inductance of the second conductor portion ($G_2$) cancel each other. Therefore, self-inductance of the shielding conductor unit 12 becomes smaller than the self-inductance of the case where the shielding conductor unit 12 is formed by a single rectilinear conductor. Mutual inductance between the strip line conductor 9 and the shielding conductor unit 12 also becomes smaller than that of the case where the shielding conductor unit 12 is formed by a single rectilinear conductor because respective inductance components cancel each other.

Figure 6:
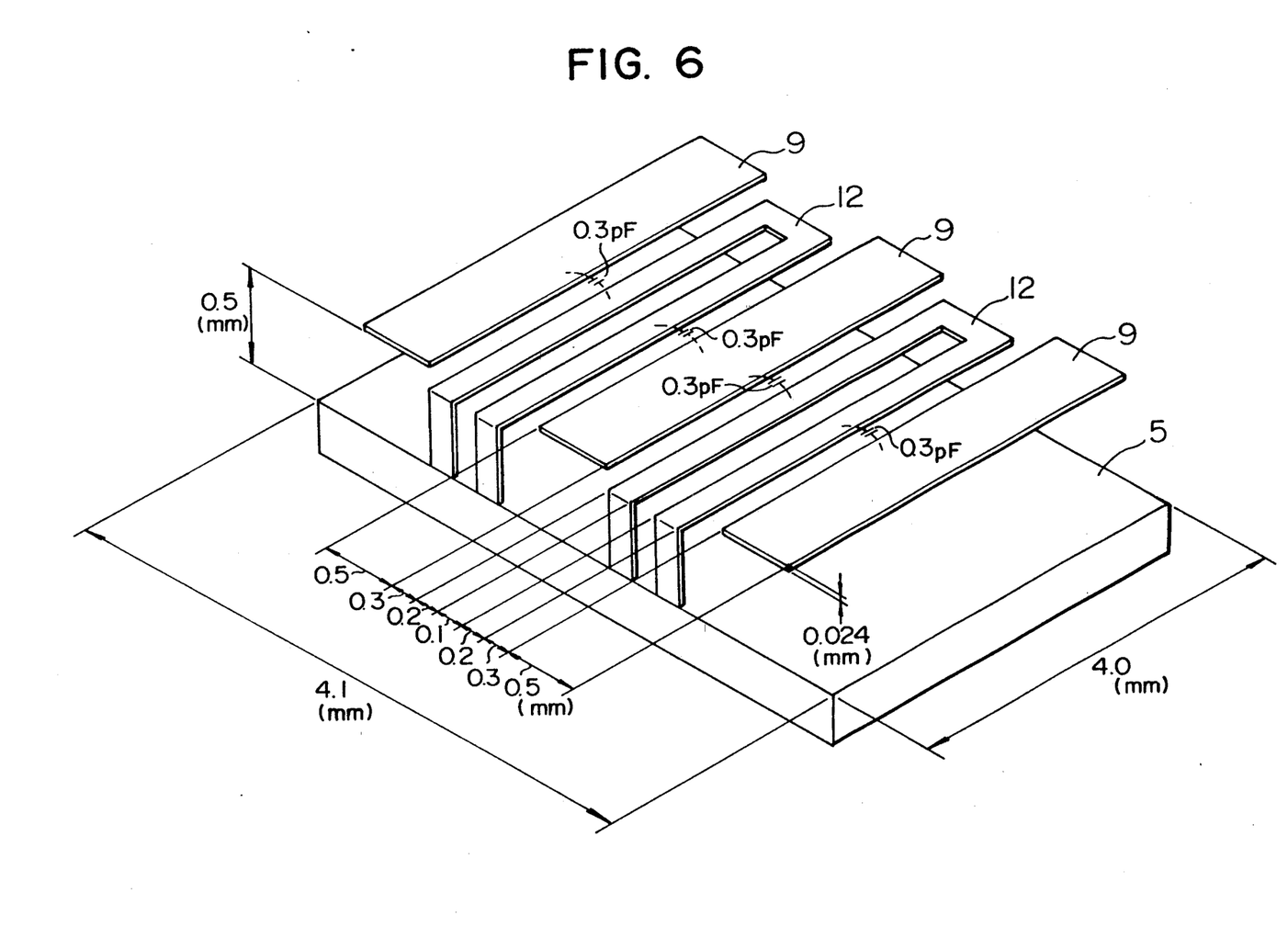
FIGS. 6 and 7 are diagrams showing dimensions of strip line conductors, a shielding conductor unit, and a reference potential plane conductor layer.
Figure 7:
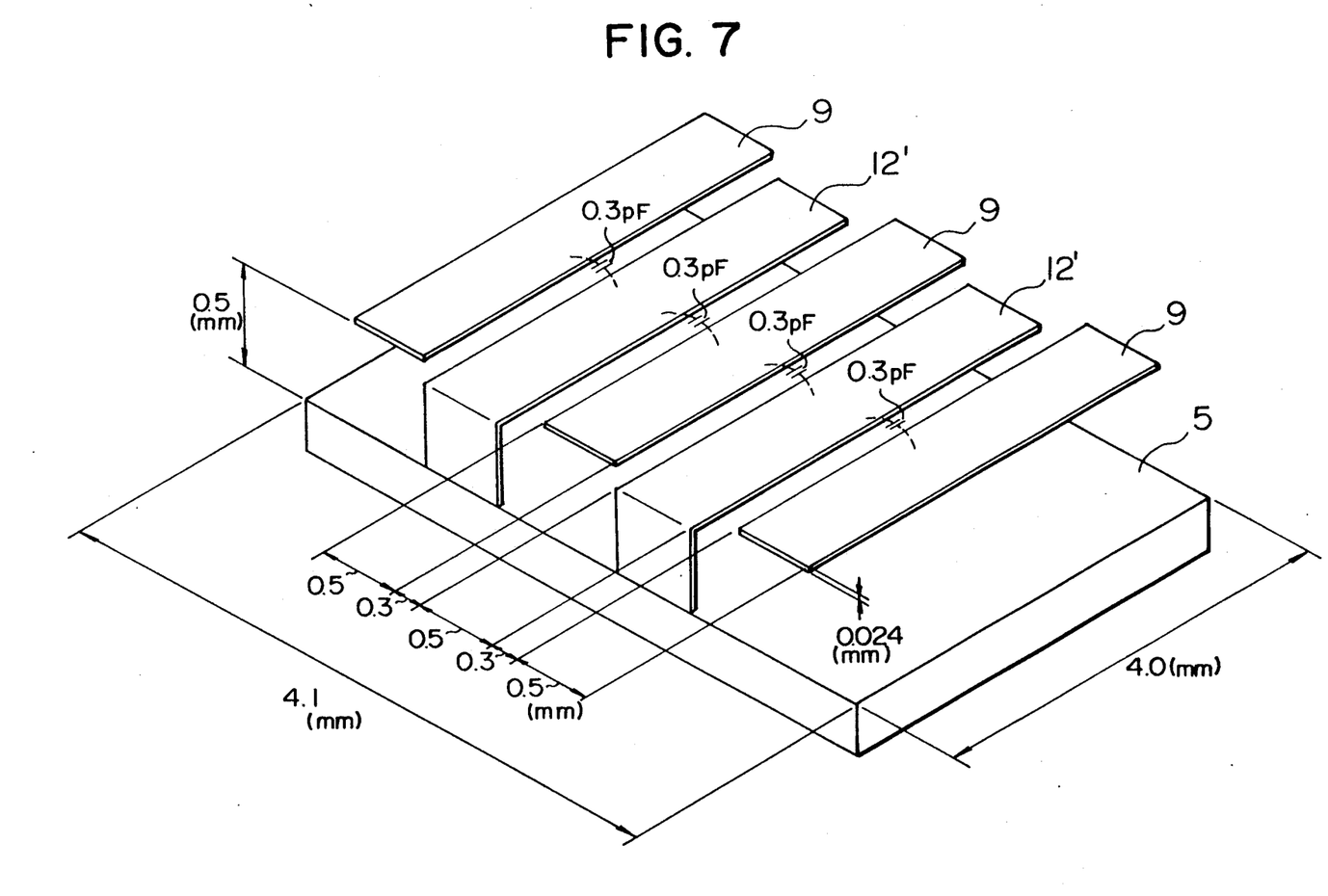

The following table shows simulation values of self-inductance ($L_S$) of the strip line conductor 9, self-inductance ($L_G$) of the shielding conductor unit 12, and mutual inductance ($M_{S-G}$) between the strip line conductor 9 and the shielding conductor unit 12 in case of a transmission line structure (the present embodiment) having the shielding conductor unit including a pair of conductor components $G_1$ and $G_2$ as described in the present embodiment between adjacent strip line conductors and a transmission line structure (prior art) having a single rectilinear conductor. It is assumed that the strip line conductors 9, the shielding conductor unit 12, and the reference potential plane conductor layer 5 have dimensions as shown in FIG. 6 (for the present embodiment) and FIG. 7 (for the prior art).

TABLE

|  | PRESENT EMBODIMENT | PRIOR ART |
|---|---|---|
| $L_S$ | 2.20 nH | 2.22 nH |
| $L_G$ | $7.99 \times 10^{-2}$ nH | 2.23 nH |
| $M_{S-G}$ | $-5.92 \times 10^{-3}$ nH | $-1.12$ nH |
| $f_0$ FOR $L_G$ | 32.5 GHz | 6.15 GHz |
| FOR $M_{S-G}$ | 119.4 GHz | 8.68 GHz |

As evident from this table, the self-inductance ($L_G$) of the shielding conductor unit 12 could be reduced in the package of the present embodiment to one-twenty-eighth of that of the prior art and the mutual inductance ($M_{S-G}$) between the strip line conductor 9 and the shielding conductor unit 12 could be reduced to one-hundred-eighty-ninth as compared with the prior art. The frequency ($f_0$) of resonance caused between the strip line conductor 9 and the shielding conductor unit 12 is expressed by $$f_0 = 1/2\pi \sqrt{LC}$$

where L represents self-inductance or mutual inductance of the conductor 9, 12 or 12', and C represents capacitance between the conductors 9 and 12 or 12'. As expressed by this equation, the resonance frequency $f_0$ is in inverse proportion to the self-inductance (or mutual inductance). In packages according to the present embodiment, therefore, the above described resonance frequency $f_0$ can be made larger than that of the prior art. By shifting the above described resonance frequency $f_0$ to the outside of the frequency band (such as 30 GHz or less, for example) of the signal current flowing through the strip line conductor 9, therefore, resonance between the strip line conductor 9 and the shielding conductor unit 12 can be suppressed. In calculating $f_0$ of the above described table, it was assumed that C was 0.3 pF.

With reference to FIG. 4, the shielding conductor unit denoted by reference numeral 12e need not necessarily be provided. However, it may be provided to make adjustment so that a strip line conductor 9 adjacent to the shielding conductor unit 12e may have the same shape and characteristic impedance as other strip line conductors.

As heretofore described, shielding conductor units each including a pair of slender conductor portions connected with each other at their first ends and connected to the reference potential at their second ends are disposed along strip line conductors in the packaged semiconductor device of the present embodiment. In such a packaged semiconductor device of the present embodiment, the following effects can be obtained.

(1) Since resonance between the strip line conductor 9 and the shielding conductor unit 12 can be suppressed, signal waveform degradation and transmission disablement can be reduced.

(2) Since the strip line conductor 9 is shielded with the shielding conductor units 12 and the reference potential plane conductor layer 5, crosstalk noise caused by signal propagation can be reduced.

(3) As a result of the above described (1) and (2), a packaged semiconductor device suitable for transmission of high frequency signals ranging from several GHz to several tens GHz can be provided.

Heretofore, the invention made by the present inventor has been concretely described by referring to the embodiment. However, it is a matter of course that the present invention is not limited to the above described embodiment, but various changes can be made without departing from the spirit of the present invention.

Figure 8:
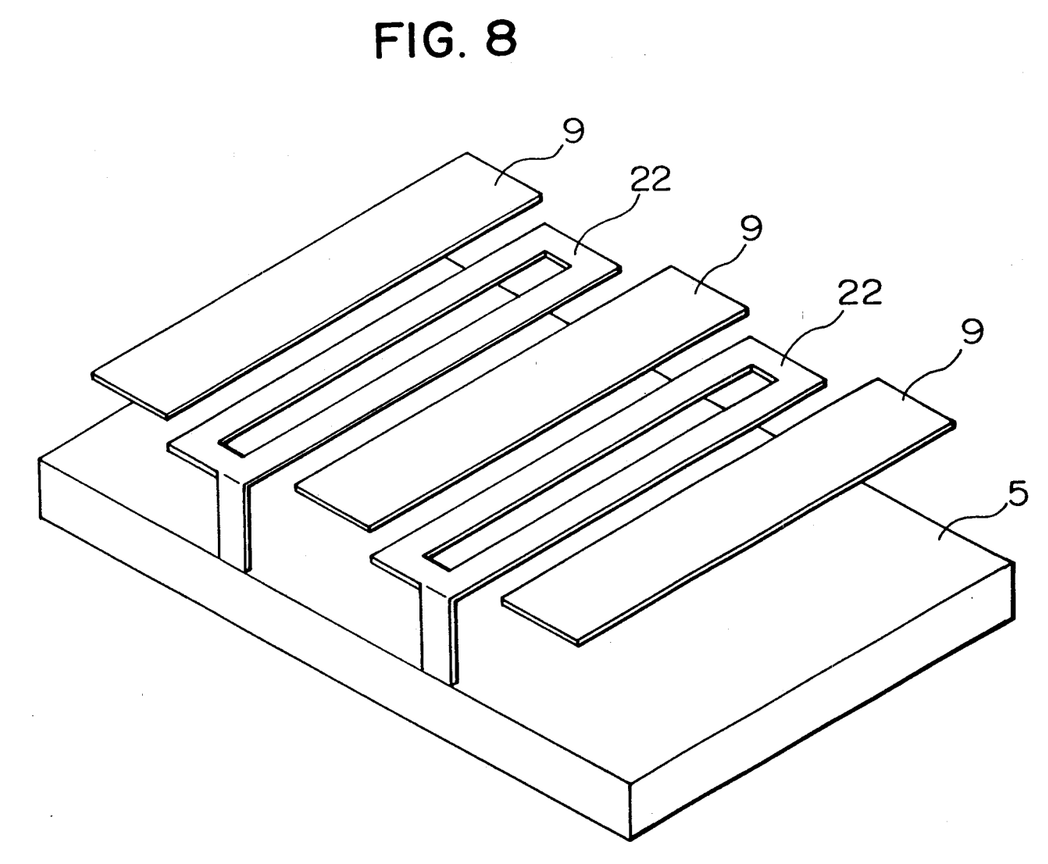
FIGS. 8, 9A, 9B, and 10 and 11 are diagrams respectively showing other shapes and arrangements of the shielding conductor unit in the high frequency signal transmission line structure according to other embodiments of the present invention.

Although the shielding conductor unit of the above described embodiment has a hairpin-shaped (U-shaped) pattern, it may have a looped pattern 22, for example, as shown in FIG. 8.

Figure 9A:
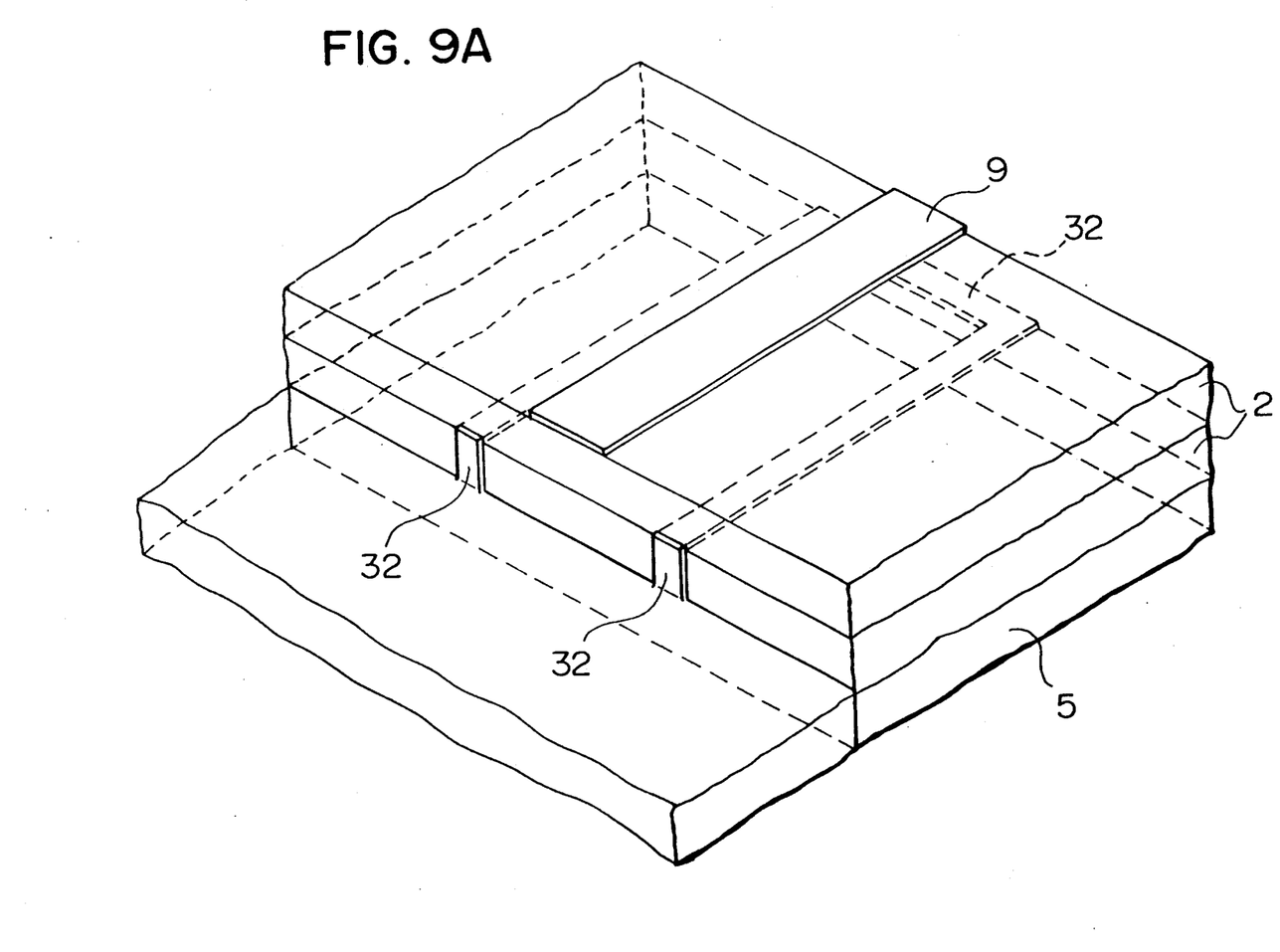

The shielding conductor unit of the above described embodiment is disposed between a plurality of strip line conductors juxtaposed substantially on the plane (principal face of the circuit board) parallel with the surface of the reference potential plan conductor layer 5. As shown in FIG. 9A, however, the shielding conductor unit 32 may be disposed at a level (such as a level of an internal layer of the circuit board 2) which is different from that of the strip line conductors 9.

Figure 9B:
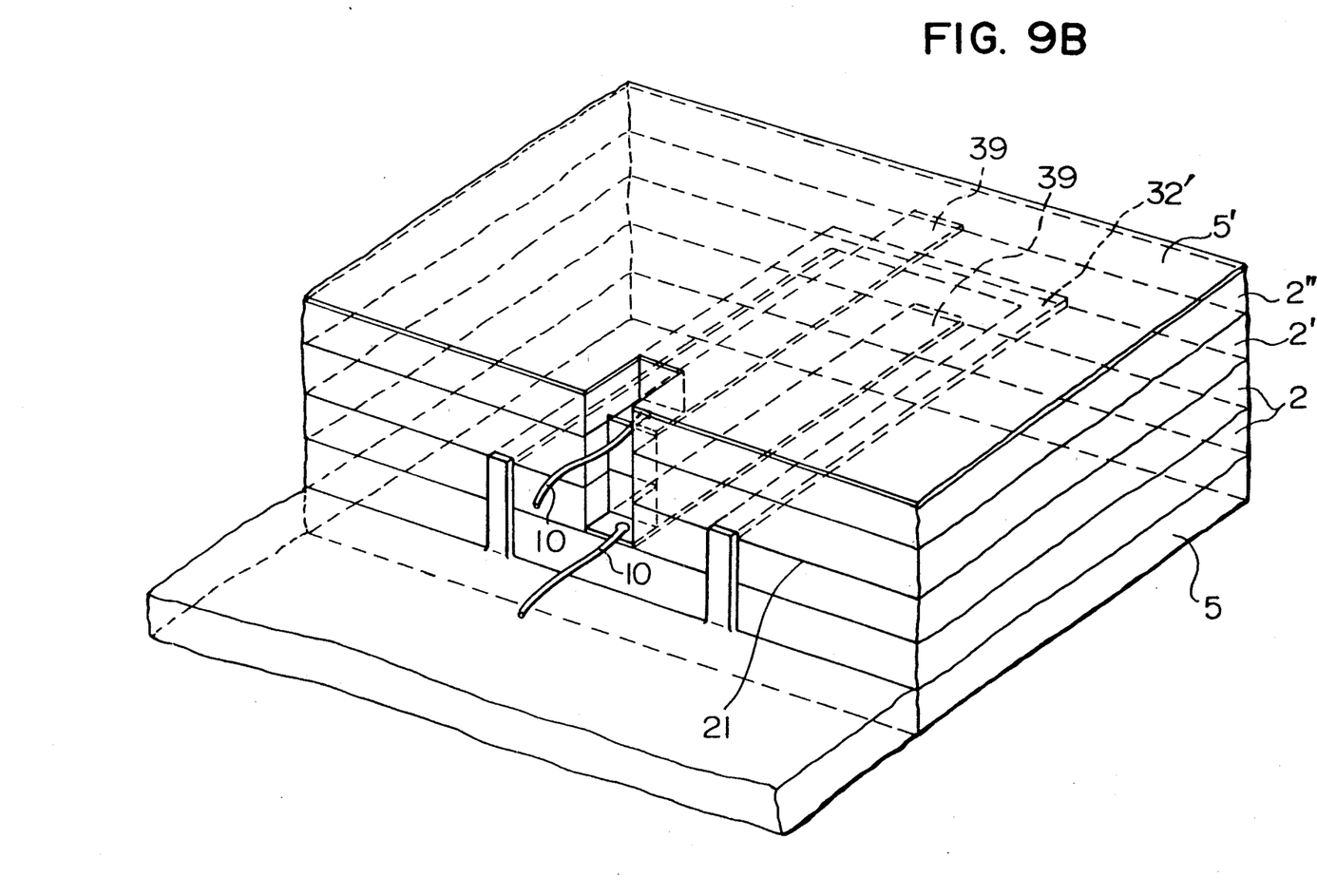

FIG. 9B shows an embodiment in which the arrangement shown in FIG. 9A is applied to a multi-layer strip line structure. In FIG. 9B, the lower strip line conductor 39 is provided with a reference potential plane conductor layer 5 via the dielectric layer 2, while the upper strip line conductor 39 is provided with a reference potential plane conductor layer 5' via the dielectric layer 2''. The reference potential plane conductor layers 5 and 5' are supplied with a reference potential, for example, the ground potential. The shielding conductor unit 32 is provided on the insulating layer 2 (i.e., in the insulating layer 2') is electrically connected, for example, with the reference potential plane conductor layer 5 so as to effect shielding between the lower and upper strip line conductors 39.

Figure 10:
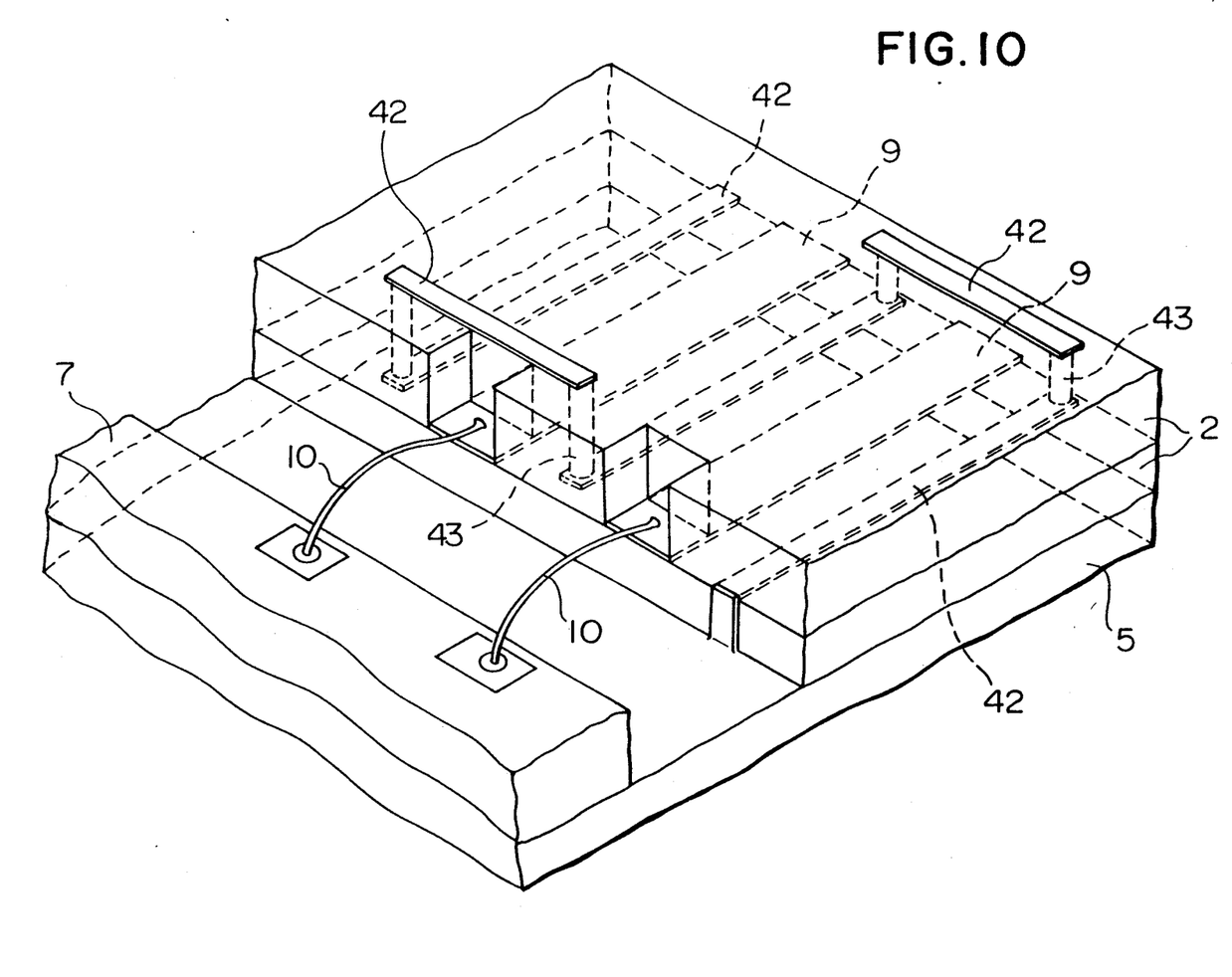

As shown in FIG. 10, shielding conductor units 42 may be formed in two layers by making connections via through-holes 43 opened through the circuit board or the frame member.

Figure 11:
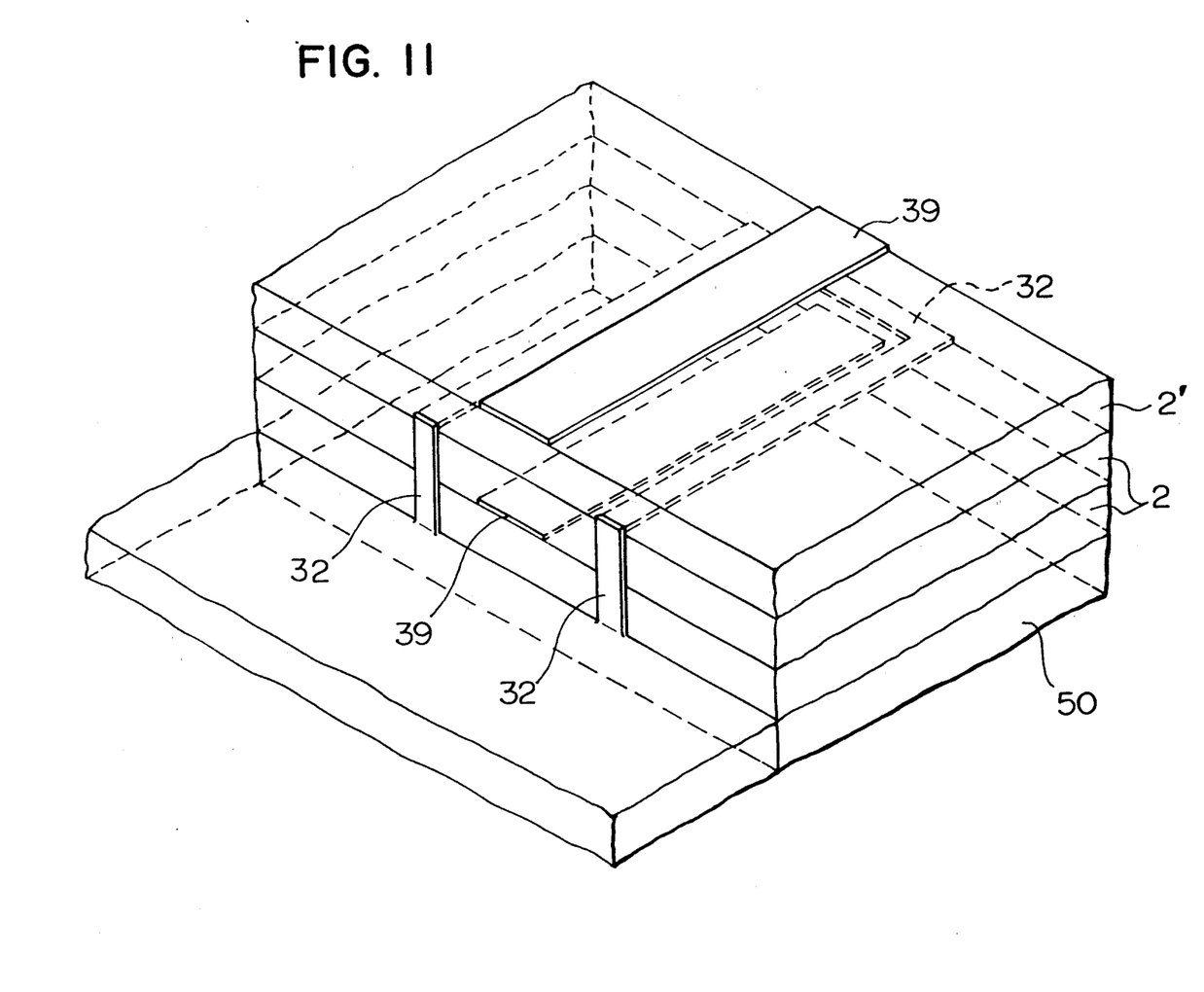

FIG. 11 shows an example of application of the arrangement shown in FIG. 9A to wiring board including a transmission line structure in which strip line conductors 39 are arranged to be laminated on the surface of the reference potential plane conductor layer 50 via an insulation layer 2'. That is to say, a shielding conductor unit 32 is disposed between two laminated strip line conductors adjacent in the direction of lamination. The layer 50 may be made of a Cu-W alloy, for example.

Description has heretofore been given mainly by referring to the case where the present invention is applied to a signal transmission line in a package. However, the present invention is not limited to such a case. For example, the present invention can be applied to internal conductors of a semiconductor chip having a logical integrated circuit performing switching operation at an ultrahigh speed and a wiring structure of various electronic components such as a wiring circuit board for high frequency signal transmission. For example, it is possible to provide a high frequency signal transmission wiring circuit board by forming the structure shown in FIG. 1 or 9 on an insulative support plate.

I claim:

1. A high frequency signal transmission line structure comprising:
   at least one reference potential plane conductor layer;
   a plurality of strip line conductors, each for carrying a signal current;
   at least one dielectric material layer interposed between said reference potential plane conductor layer and said strip line conductors; and
   a shielding conductor unit for shielding said strip line conductors provided between adjacent two strip line conductors, said shielding conductor unit including first and second slender conductor portions extending substantially in a direction parallel with a lengthwise direction of said strip line conductors and connected to be integral with each other at their first ends, second ends of said first and second slender conductor portions being electrically connected with said reference potential plane conductor layer.

2. A structure according to claim 1, in which said plurality of strip line conductors are juxtaposed substantially on a plane parallel with a surface of said reference potential plane conductor layer, and said shielding conductor unit is disposed between adjacently juxtaposed two strip line conductors on said dielectric material layer.

3. A structure according to claim 2, in which both of said second ends of said first and second slender conductor portions of said shielding conductor unit extend so as to be electrically connected with said reference potential plane conductor layer and is substantially U-shaped.

4. A structure according to claim 2, in which said second ends of said first and second slender conductor portions of said shielding conductor unit are also connected to be integral with each other and to be in a closed loop shape and the so connected second ends of said shielding conductor unit are electrically connected with said reference potential plane conductor layer.

5. A structure according to claim 1, in which said plurality of strip line conductors are arranged to be laminated with an insulating material layer interposed therebetween, and said shielding conductor unit is disposed between adjacently laminated two strip line conductors in said insulating material layer.

6. A structure according to claim 5, in which both of said second ends of said first and second slender conductor portions of said shielding conductor unit extend so as to be electrically connected with said reference potential plane conductor layer and are substantially U-shaped.

7. A structure according to claim 5, in which said second ends of said first and second slender conductor portions of said shielding conductor unit are also connected to be integral with each other and to be in a closed loop shape and the so connected second ends of said shielding conductor unit are electrically connected with said reference potential plane conductor layer.

8. A packaged semiconductor device comprising a package having a cavity therein and a semiconductor chip in said cavity, said package comprising:
   an electrically conductive base plate serving as a reference potential plane conductor layer;
   a dielectric material layer formed on said base plate and having an opening therein;
   a plurality of strip line conductors formed on said dielectric material layer and electrically connected with said semiconductor chip for carrying signal transmission to an from said semiconductor chip;
   shielding conductor units for shielding said strip line conductors, one provided between adjacent two strip line conductors on said dielectric material layer, each of said shielding conductor units including first and second slender conductor portions extending substantially in a direction parallel with a lengthwise direction of said strip line conductors and connected to be integral with each other at their first ends, second ends of said first and second slender conductor portions being electrically connected with said electrically conductive base plate;
   a cap structure formed over said base plate and partially in contact with said strip line conductors, said shielding conductor units and said dielectric material layer, said cap structure, said dielectric material layer and said base plate defining said cavity for said semiconductor chip.

9. A packaged semiconductor device according to claim 8, in which said cap structure includes a frame-shaped dielectric layer formed on said strip line conductors, said shielding conductor units and said dielectric material layer and includes a cap plate formed on said frame-shaped dielectric layer with an electrically conductive layer interposed therebetween and formed over said base plate, said electrically conductive layer being arranged for receiving a reference potential to contribute to formation of a strip line structure together with said strip line conductors and said frame-shaped dielectric layer.

10. A packaged semiconductor device according to claim 8, in which said cap structure includes a frame-shaped dielectric layer formed on said strip line conductors, said shielding conductor units and said dielectric material layer and includes an electrically conductive cap plate formed on said frame-shaped dielectric layer and over said base plate, said electrically conductive cap plate being arranged for receiving a reference potential to contribute to formation of a strip line structure together with said strip line conductors and said frame-shaped dielectric layer.

11. A wiring circuit board comprising:
   a supporting plate;
   at least one reference potential plane conductor layer provided on said supporting plate;
   a plurality of strip line conductors, each for carrying a signal current;
   at least one dielectric material layer interposed between said reference potential plane conductor layer and said strip line conductors; and
   a shielding conductor unit for shielding said strip line conductors provided between adjacent two strip line conductors, said shielding conductor unit including first and second slender conductor portions extending substantially in a direction parallel with a lengthwise direction of said strip line conductors and connected to be integral with each other at their first ends, second ends of said first and second slender conductor portions being electrically connected with said reference potential plane conductor layer.

* * * * *